United States Patent
Ozuna et al.

(10) Patent No.: US 12,428,275 B2
(45) Date of Patent: Sep. 30, 2025

(54) COMMUNICATION CABINET LIFT AND TRANSPORT SYSTEM

(71) Applicant: CORNING RESEARCH & DEVELOPMENT CORPORATION, Corning, NY (US)

(72) Inventors: Andrea Marie Ozuna, Fort Worth, TX (US); Karyne Poissant Prevratil, Fort Worth, TX (US); Joshua Thomas Smith, Mooresville, NC (US); Anthony Lynn Williams, Fort Worth, TX (US)

(73) Assignee: CORNING RESEARCH & DEVELOPMENT CORPORATION, Corning, NY (US)

( * ) Notice: Subject to any disclaimer, the term of this patent is extended or adjusted under 35 U.S.C. 154(b) by 447 days.

(21) Appl. No.: 17/705,491

(22) Filed: Mar. 28, 2022

(65) Prior Publication Data

US 2023/0303370 A1    Sep. 28, 2023

(51) Int. Cl.
*B66F 9/075*         (2006.01)

(52) U.S. Cl.
CPC .................................. *B66F 9/075* (2013.01)

(58) Field of Classification Search
CPC ... B66F 9/075; B66F 3/36; B66F 3/24; H05K 5/0234; H05K 7/1488; H05K 7/186
See application file for complete search history.

(56) References Cited

U.S. PATENT DOCUMENTS

| | | |
|---|---|---|
| 2,446,518 A | 8/1948 | Na |
| 3,486,650 A * | 12/1969 | Boone .................. B62B 3/0625 414/458 |
| 5,667,230 A | 9/1997 | Riley et al. |
| 5,716,186 A * | 2/1998 | Jensen ................ B60B 33/0063 187/244 |
| 7,311,487 B1 * | 12/2007 | Crossley .................. B65G 7/02 414/458 |

(Continued)

FOREIGN PATENT DOCUMENTS

| | | |
|---|---|---|
| CA | 2560578 A1 | 4/2007 |
| CN | 113241651 A | 8/2021 |

(Continued)

OTHER PUBLICATIONS

European Patent Application No. 22164834.8, Extended European Search Report, dated Oct. 5, 2022; 8 pages; European Patent Office.

*Primary Examiner* — Jonathan Snelting
(74) *Attorney, Agent, or Firm* — Kapil U. Banakar (57) ABSTRACT

A communication cabinet lift and transport system is provided including a lift and transport assembly having a support bar with at least one attachment bracket configured to be attached to a frame of the communication cabinet and a caster jack disposed near a either end of the support bar. Each caster jack including a bar mount configured to affix the caster jack to the support bar, a caster wheel disposed at an end of the caster jack, and a jack assembly configured to extend and retract the caster wheel relative to the bar mount. The communication cabinet lift and transport system is configured to raise and lower the communication cabinet relative to a surface, and translate the communication cabinet about the surface when the lift and transport system is in a raised position.

20 Claims, 7 Drawing Sheets

(56) References Cited

U.S. PATENT DOCUMENTS

| | | | |
|---|---|---|---|
| 7,494,154 | B2 | 2/2009 | Richards et al. |
| 7,811,044 | B2 * | 10/2010 | Warhurst .............. B60P 1/6445 |
| | | | 414/458 |
| 10,807,845 | B2 * | 10/2020 | Weber ................... B60D 1/665 |
| 2017/0073111 | A1 | 3/2017 | McKay et al. |
| 2017/0260027 | A1 | 9/2017 | DeBattiste |
| 2023/0147728 | A1 * | 5/2023 | Archibald .......... G05D 23/1931 |
| | | | 361/679.53 |

FOREIGN PATENT DOCUMENTS

| | | |
|---|---|---|
| IN | 110155137 B | 1/2021 |
| JP | 2000-225949 A | 8/2000 |

* cited by examiner

COMMUNICATION CABINET LIFT AND TRANSPORT SYSTEM

FIELD

This disclosure generally pertains to communication cabinets, and more particularly to a system and method for lifting and transporting a communication cabinet.

BACKGROUND

Communication equipment cabinet, such as fiber optic equipment cabinets may include a frame configured to receive one or more pieces of communication equipment and may include doors or panels to enclose the communication equipment for protection, air flow routing, or the like. Typical communication cabinets may weigh several hundred pounds and be difficult to maneuver in a datacenter, or other facility. As customer demand for density of connections in communication cabinet increase, the size of the communications cabinets may also increase, adding additional weight and height. In some cases, customers may request fully or partially populated communication cabinets, e.g. at least a portion of the communication cabinet is populated with communication equipment, which also adds a considerable weight to the communication cabinet during the installation process.

Typically to remove a communication cabinet from a shipping pallet, the communication cabinet may be tilted to install a transport system, such as a pallet jack or dolly. Similarly, the communication cabinet may again be tilted to remove the transport system. Tilting of the communication cabinet may require special tools and/or be inherently dangerous, due to risk of tipping. Additionally, as the height of the communication cabinet increases, there is limited clearance above a communication cabinet to facilitate tilting.

Another conventional method of transporting a communication cabinet may be integrated caster systems. These communications cabinets may include a plurality of casters attached to the frame. This may enable movement of the communication cabinet across a floor, but the relatively small size of the casters may limit or prevent the communication cabinet from traversing small obstacles, such as elevator gaps, thresholds of doors, elevation changes, or the like. The communication cabinet may be tilted to traverse these obstacles and sudden stops due to obstacles may cause tip hazards. Additionally, the integrated caster system does not alleviate the need to tilt a communication cabinet to remove the communication cabinet from a shipping pallet.

SUMMARY

The lifting and transport system discloses herein enables safe lifting and transport of heavy communication cabinets. The lifting and transport system may be removably attached to the frame of a communication cabinet and raised nominally from the floor or pallet. The clearance may be sufficient to remove the pallet and transport the communication cabinet lower than the available overhead clearance. Further, raising and lowering of the communication cabinet may be performed with the cabinet substantially level, limiting, or avoiding, safety issues related to tilting of the communication cabinet.

In addition to the lifting capabilities, the lift and transport system includes large, e.g. greater than 4-inch, caster wheels for transportation. The larger caster wheels may easily traverse doorway thresholds, lifting ramp edges, floor tiles, elevator gaps, or the like, without adding to the overall height of the communication cabinet itself. Compared to commercially available lifting solutions, the disclosed lift and transport system attaches to the frame elements of the communication cabinet instead of lifting from below, which allows the communication cabinet to be removed from pallets and placed on floors without tilting to remove the lifting which requires additional tools and adds safety risks.

Additional features and advantages will be set forth in the detailed description which follows, and in part will be apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings are illustrative of selected aspects of the present description, and together with the specification explain principles and operation of methods, products, and compositions embraced by the present description. Features shown in the drawing are illustrative of selected embodiments of the present description and are not necessarily depicted in proper scale.

BRIEF DESCRIPTION OF THE DRAWINGS

While the specification concludes with claims particularly pointing out and distinctly claiming the subject matter of the written description, it is believed that the specification will be better understood from the following written description when taken in conjunction with the accompanying drawings, wherein:

The embodiments set forth in the drawings are illustrative in nature and not intended to be limiting of the scope of the detailed description or claims. Whenever possible, the same reference numeral will be used throughout the drawings to

DETAILED DESCRIPTION

Reference will now be made in detail to certain embodiments, examples of which are illustrated in the accompanying drawings, in which some, but not all features are shown. Indeed, embodiments disclosed herein may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

The claims set forth below are incorporated by reference into this Detailed Description section.

Terms like front, back, top, bottom, side, etc. are relative terms used for convenience and ease of explanation and are not intended to be limiting.

As used herein, the term "communication cabinet" shall mean a frame configured to support one or more pieces of communication equipment, such as fiber optic communication equipment or electronic communication equipment, and/or fiber, wire, or cable routing assemblies. The frame may optionally include one or more doors or panels to enclose the communication equipment.

Figure 1:
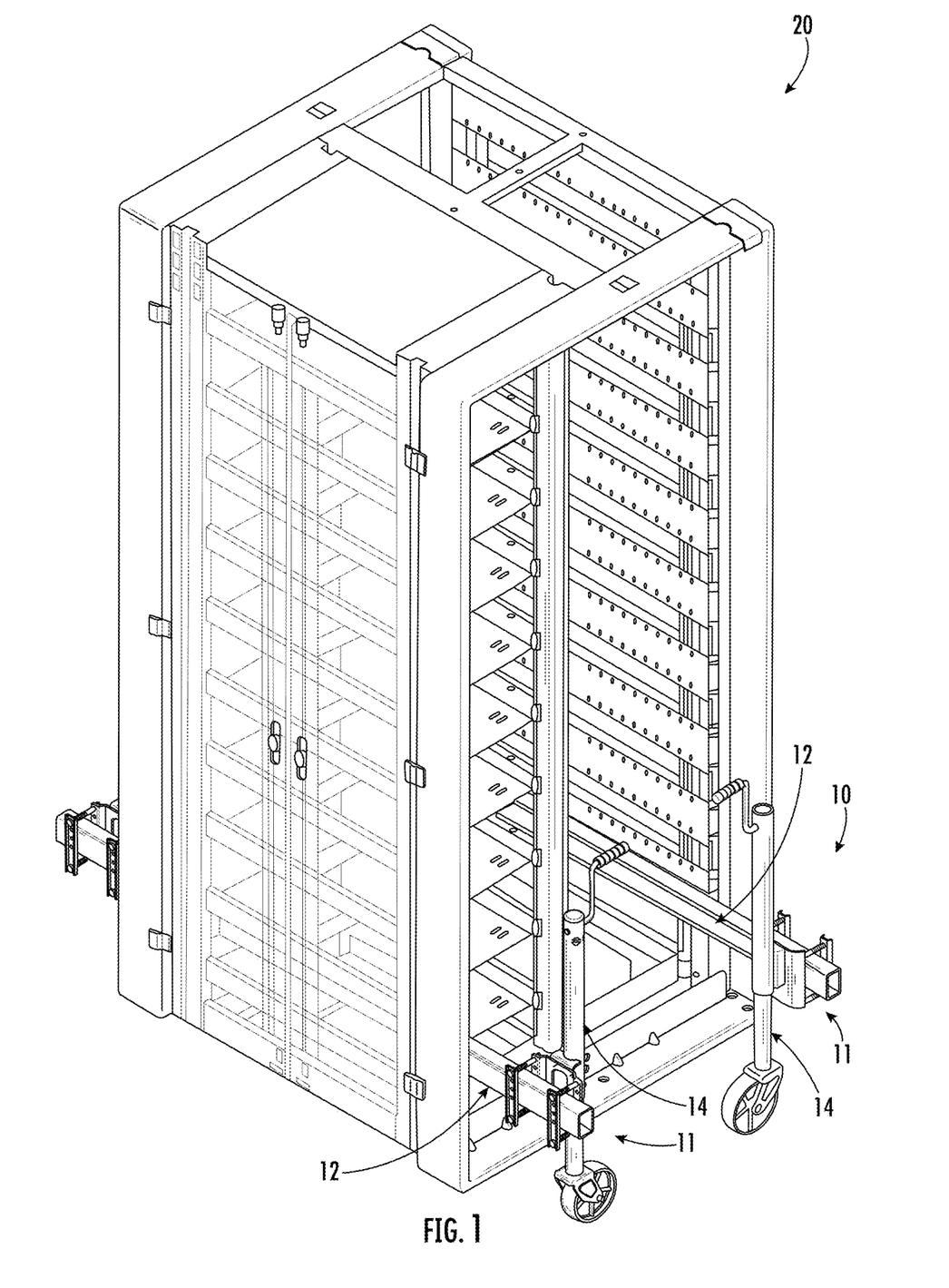
FIG. 1 is a perspective view of a communication cabinet lift and transport system installed on a communication cabinet according to an example embodiment.
Figure 2:
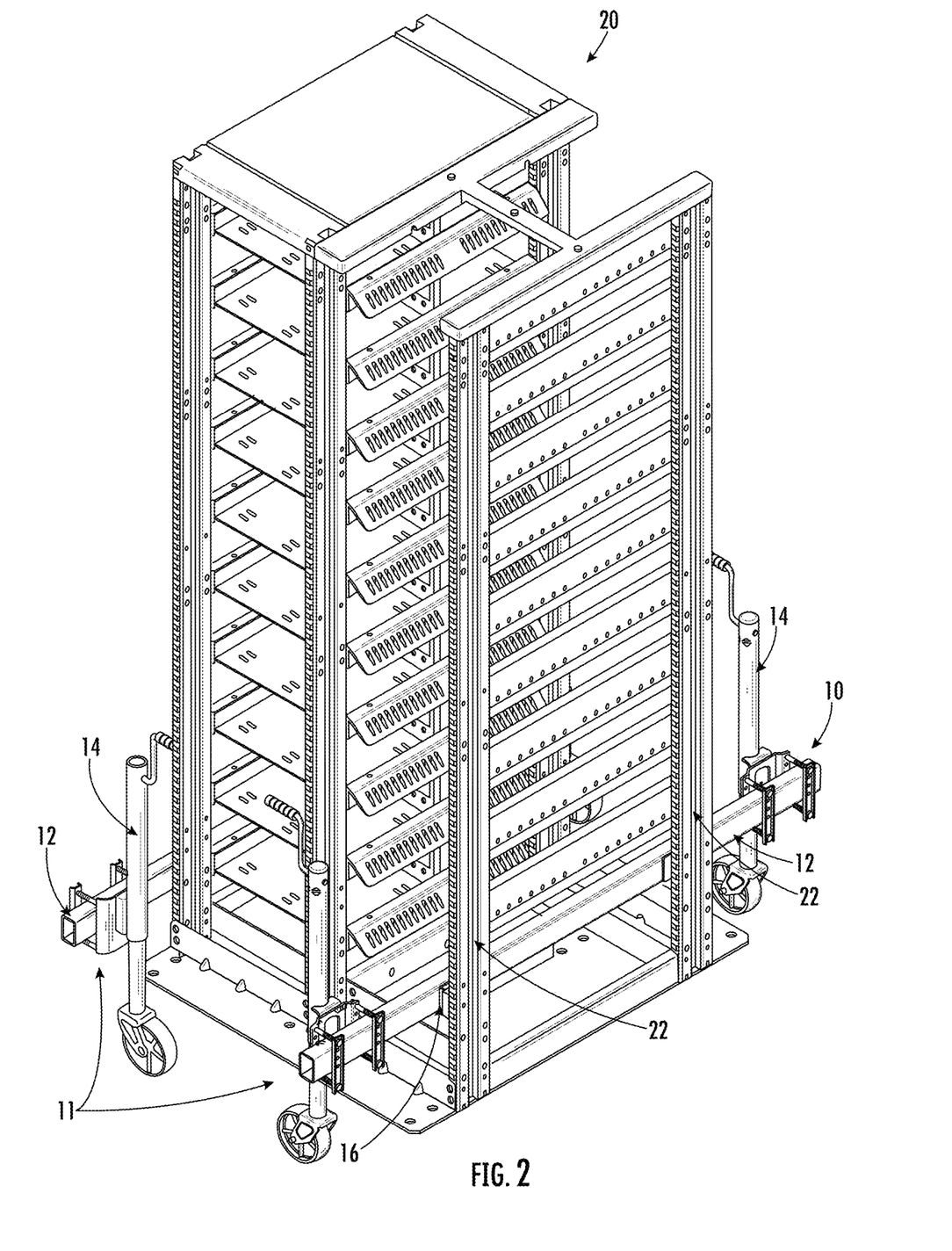
FIG. 2 is a perspective view of the communication cabinet lift and transport system installed in the communication cabinet of FIG. 1 with the side panels and doors removed for clarity according to an example embodiment.
Figure 3:
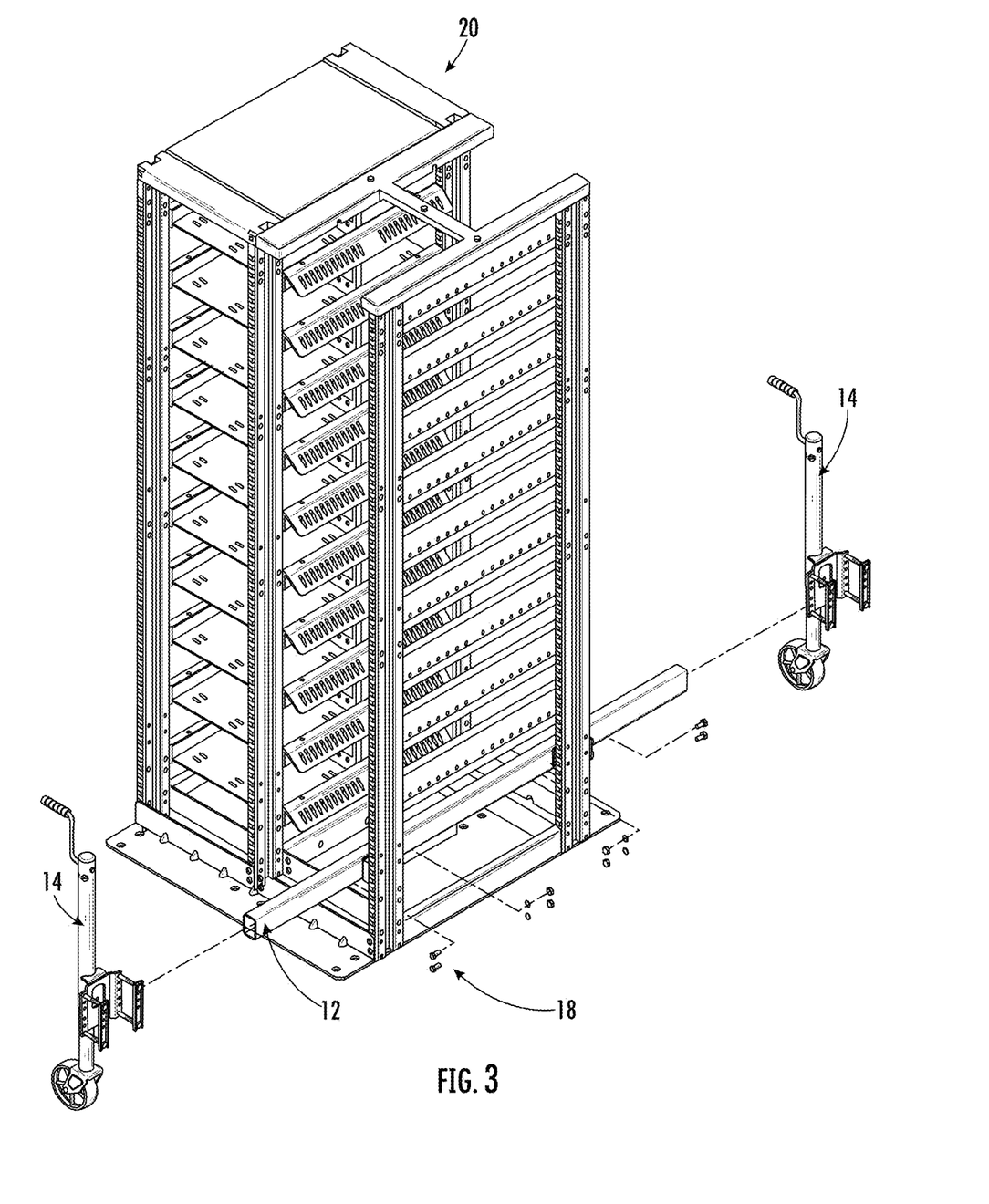
FIG. 3 illustrates an exploded view of a communication cabinet lift and transport assembly installed in a communication cabinet according to an example embodiment.

FIG. 1 is a perspective view of a communication cabinet lift and transport system, e.g. lift and transport system 10, installed on a communication cabinet 20 according to an example embodiment. The communication cabinet 20 may be configured to house communication equipment, for example fiber optic communication equipment or electronic communication equipment, and/or fiber, wire, or cable routing assemblies. The lift and transport system 10 may include at least one lift and transport assembly 11. Each lift and transport assembly 11 may include a support bar 12 and a caster jack 14 disposed at either end of the support bar 12. The caster jacks 14 may be disposed near the first end of the support bar 12 and second end of the support bar 12, respectively, e.g. the first caster jack 14 is positioned closer to the first end of the support bar 12 than the second end and the second caster jack 14 is positioned closer to the second end of the support bar 12 than the first end. The lift and transport system 10 may be configured to raise and/or lower the communication cabinet 20 relative to a surface, such as a floor, truck bed, loading platform, or the like. The lift and transport system 10 may also be configured to translate the communication cabinet 20 about the surface, when the lift and transport system 10 is in a raised position. FIG. 2 illustrates a perspective view of the communication lift and transport system 10 installed in the communication cabinet 20 of FIG. 1 with the side panels and doors removed to show the frame elements 22 more clearly. FIG. 3 illustrates an exploded view of a lift and transport assembly 10 installed in a communication cabinet 20. In an example embodiment, two lift and transport assemblies 11 are utilized to provide stability at or near each corner. However, other configurations are also contemplated, such as three or more lift and transport assemblies 11 utilized to distribute weight of a large, or long, communication cabinet.

Figure 4:
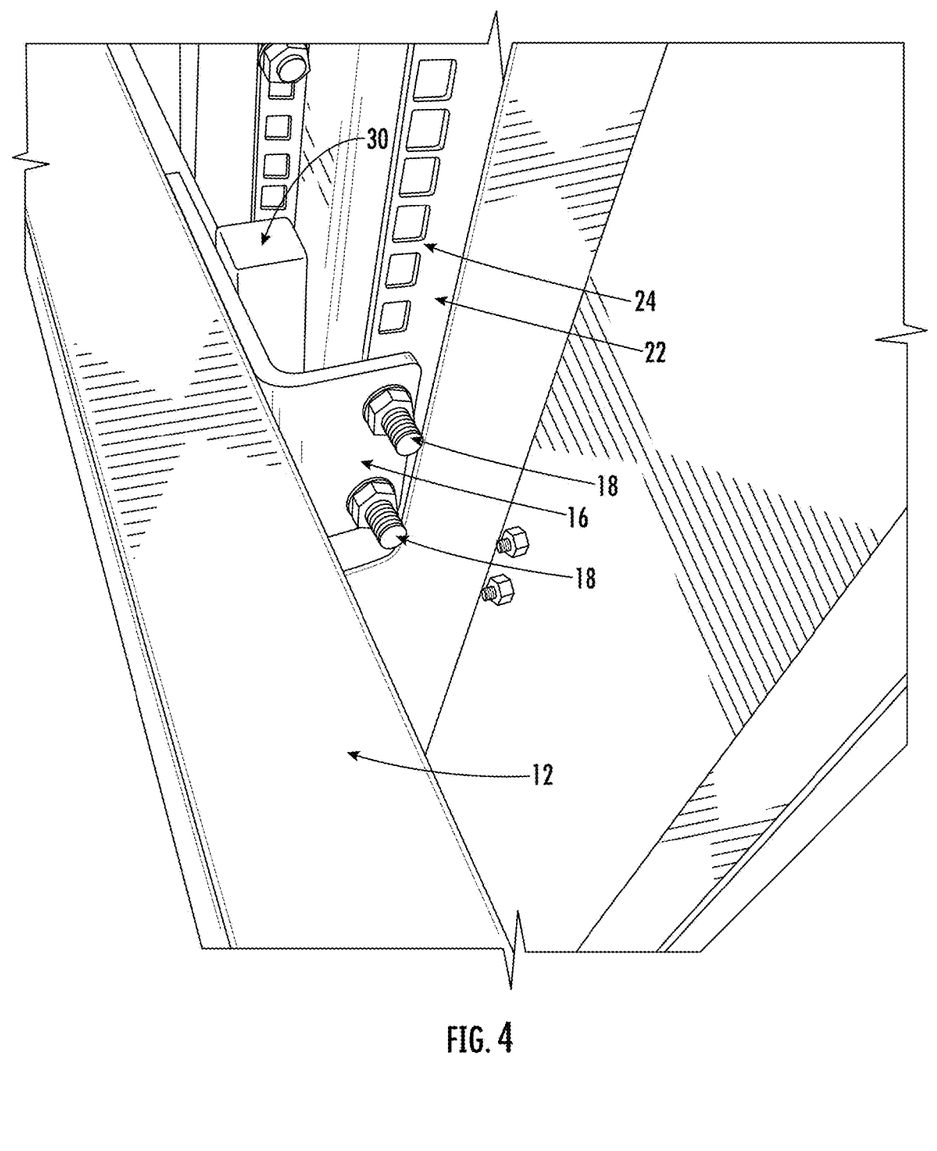
FIG. 4 illustrates a detail of attachment of the support bar of the communication cabinet lift and transport assembly to the frame of the communication cabinet according to an example embodiment.

The support bar 12 may include at least one attachment bracket 16 configured to be attached to a frame element 22 of the communication cabinet 20. The attachment bracket 16 may be affixed to the support bar by welding, fasteners, clamping members, or the like. FIG. 4 illustrates a detail of an attachment bracket 16 of a support bar 12 of a lift and transport assembly 11 to a frame element 22 of the communication cabinet 20 according to an example embodiment. In the depicted embodiment, the attachment bracket 16 is welded to the support bar 12. The attachment bracket 16 includes apertures to receive a fastener 18 therethrough. The fasteners 18 may be bolts, ball lock pins, or other suitable fasteners 18. The apertures may align with one or more mounting holes in a frame element 22 of the communication cabinet, such that the fasteners 18 may be inserted through both the apertures of the attachment bracket 16 and the mounting holes of the frame element 22. In some example embodiments, the attachment bracket 16 may include an anti-rotation or antitorque feature 30. The anti-torque feature 30 may be an extension of the attachment bracket 16 configured to engage a portion of the frame element 22, such that the rotation of the support bar 12 relative thot the mounting holes 24 is limited or prevented. In the depicted example, the antitorque feature 30 is a rectangular block of material, such as metal, that extends along and outward from the attachment bracket 16. The antitorque feature 30 may abut or nearly abut the face of a frame element 22, when the attachment bracket 16 is attached to the frame element 22. As the communication cabinet 20 is raised, the weight of the communication cabinet 20 shifts to the fasteners 18 in the attachment bracket 16 and frame elements 22, which may cause the lift and transport assembly 11 to rotate about the fasteners 18. This rotational force is limited or prevented by the antitorque feature 30 engagement with the face of the frame element 22.

The support bar 12 may be formed from a tube, such as a metal tube, for example steel tubing. The metal tubing may be rectangular, cylindrical, D-shaped or any other suitable shape. In some examples, the metal tubing may have a least one flat face which may be utilized to reduce or eliminate rotation of the metal tube in a manner similar to the antitorque feature 30, as discussed above.

Figure 5:
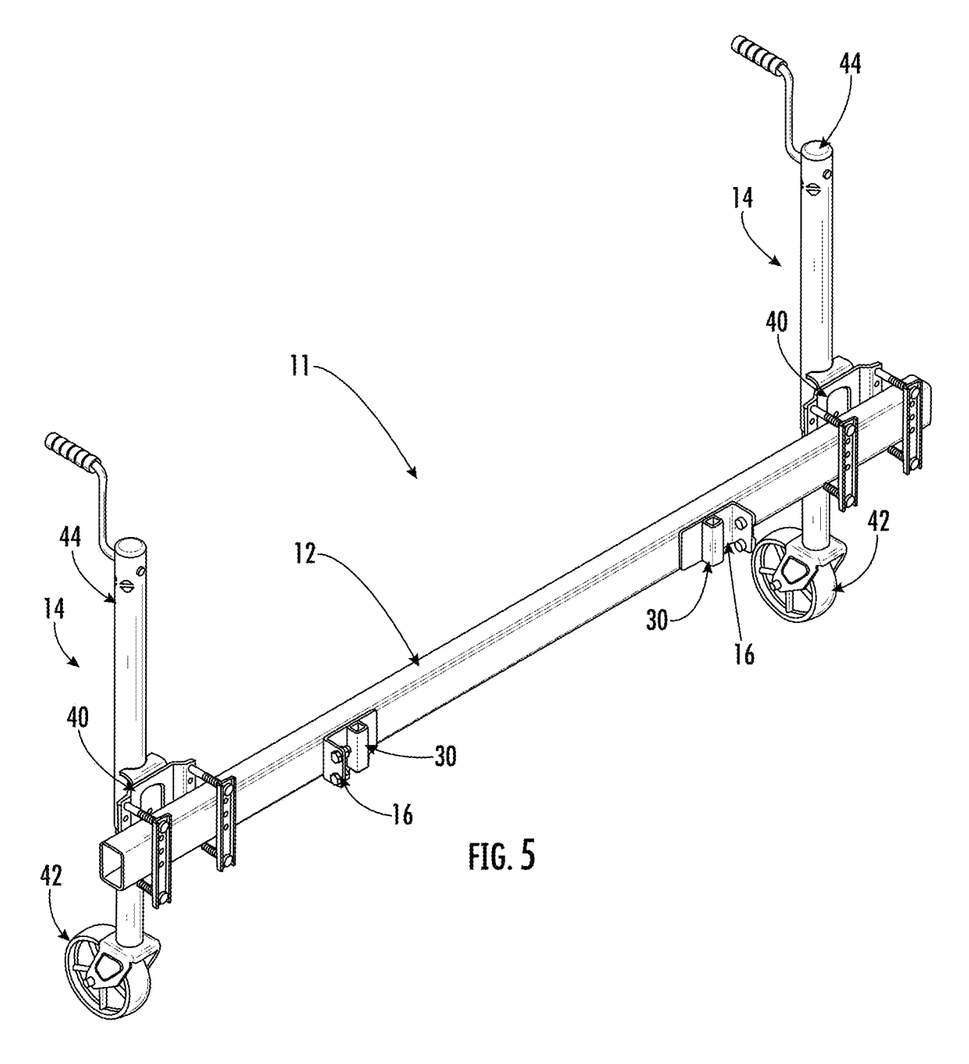
FIG. 5 illustrates a perspective view of the communication cabinet lift and transport assembly according to an example embodiment.
Figure 6:
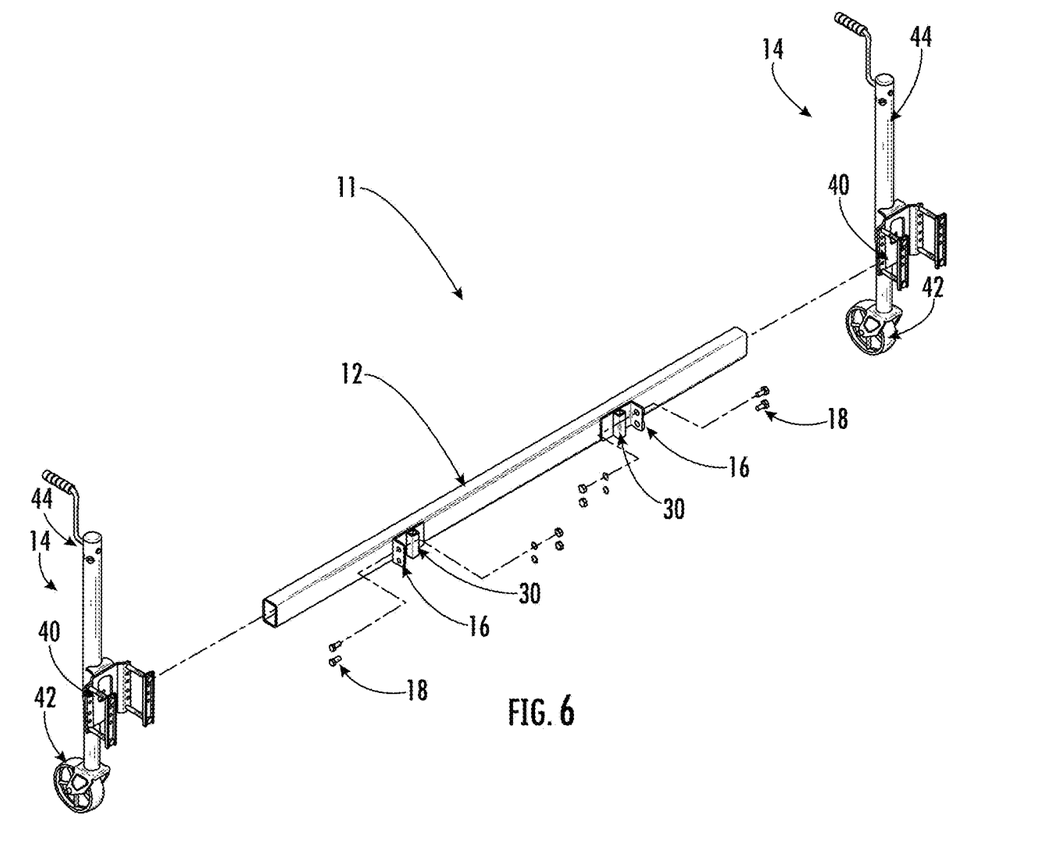
FIG. 6 illustrates an exploded view of the communication cabinet lift and transport assembly according to an example embodiment.

FIG. 5 illustrates a perspective view of the lift and transport assembly 11 and FIG. 6 illustrates an exploded view of the lift and transport assembly 11 according to an example embodiment. As discussed above in reference to FIG. 1, a caster jack 14 may be disposed at either end of the support bar 12. The caster jack 14 may include a bar mount 40, a caster wheel 42, and a jack assembly 44. The bar mount 40 may be permanently mounted to the support bar 12, such as by welding a mounting plate to the support bar 12. In some example embodiments, the bar mount 40 may be slide mounted to the support bar 12. The slide mount may be a clamp type mounting having one or more mounting plates configured to squeeze the support bar 12 therebetween by tightening fasteners such as a plurality of bolts. The slide mount may be loosened to enable the caster jacks 14 to be translated along the support bar 12 to one of a plurality of mounting locations. Additionally or alternatively, the bar mount 40 may include a mounting plate including a plurality of fasteners configured to pass through mount holes in the support bar 12. The support bar 12 may include a plurality of mounting holes corresponding to a plurality of mounting positions. Utilizing the plurality of mounting locations, the caster jack 14 can be optimally positioned near the frame elements 22 for communication cabinets of different depths or widths.

In an example embodiment, the caster jack 14 may be fixed in a vertical orientation relative to the support bar. In some example embodiments, the caster jack 14 may be transitioned from a vertical position to a horizontal position for storage. The bar mount 40 may include one or more locking pins, such as a spring biased locking pin, to maintain the caster jack 14 in the desired position. Rotation of the caster jack 14 to the horizontal position may reduce the profile of the lift and transport system 10 for storage.

The caster wheels 42 may be selected based on the type of surface or surfaces the communication cabinet 20 is being transported across. The caster wheels 42 may be formed from one or more materials, including but not limited to steel, iron, neoprene, nylon, phenolic, polyurethane, rubber, thermoplastic, or the like. The caster wheels 42 may be smooth or have a tread to provide grip based on the surface. The size of the caster wheels 42 may be selected based on the anticipated obstacles to transportation of the communication cabinet 20, for example doorway thresholds, lifting ramp edges, floor tile or elevator gaps, or the like. Larger caster wheels 42, such as greater than or equal to 4 inches, may more easily traverse larger obstacles. Some example caster wheel sizes include, without limitation, 3 inches, 3 1/16 inch, 3 7/8 inches, 4 inches, 4 7/8/inches, 5 inches, 6 inches, 6 1/4 inch. 6 7/8 inches, 7 7/8 inches, and 8 inches. The caster wheel 42 may be configured to swivel 360 degrees about an axis defined by the jack assembly 44.

In some example embodiments, the caster wheels 42 may include a break or lock feature configured to resist movement of the lift and transport assembly 11. For example, the caster wheels 42 may include a rocker lock. The rocker lock may be configured to pivot to a first position to engage the caster wheel 42 to apply pressure and/or friction to resist rotation of the caster wheel 42. The rocker lock may be pivoted to a second position disengaging the caster wheel 42 enabling free rotation of the caster wheel 42.

The jack assembly 44 may be configured to extend and retract the caster wheel 42 relative to the bar mount 40. Extending the caster wheel 42 raises the support bar 12 and communication cabinet 20, when mounted thereto. Similarly, retracting the caster wheel 42 lowers the support bar 12 and communication cabinet 20. In an example embodiment, the jack assembly 44 may include a manually operated crank operator configured to extend and retract the caster jack 14 between a raised position and the lowered position. In some example embodiments, the jack assembly 44 may include a hydraulic operator configured to extend and retract the caster jack 14 between a raised position and the lowered position.

The lift and transport system 10 may be configured to raise and lower the communication cabinet 20 between a raised position and a lowered position. In the lowered position, the communication cabinet 20 may be in contact with the surface. In the raised position, the communication cabinet may be supported by the lift and transport system 10, such that the lift and transport system 10 may translate the communication cabinet 20 about the surface. In the raised position, the communication cabinet 20 may be about 0.25 inches to 2.5 inches from the surface. In some embodiments, the lift and transport system may utilize a raised position, such as 2.5 inches to remove shipping materials, such as a shipping pallet, safely, and then transition to a transport position, such as 0.25 inches for translation of the communication cabinet with the lowest center of gravity.

Figure 7:
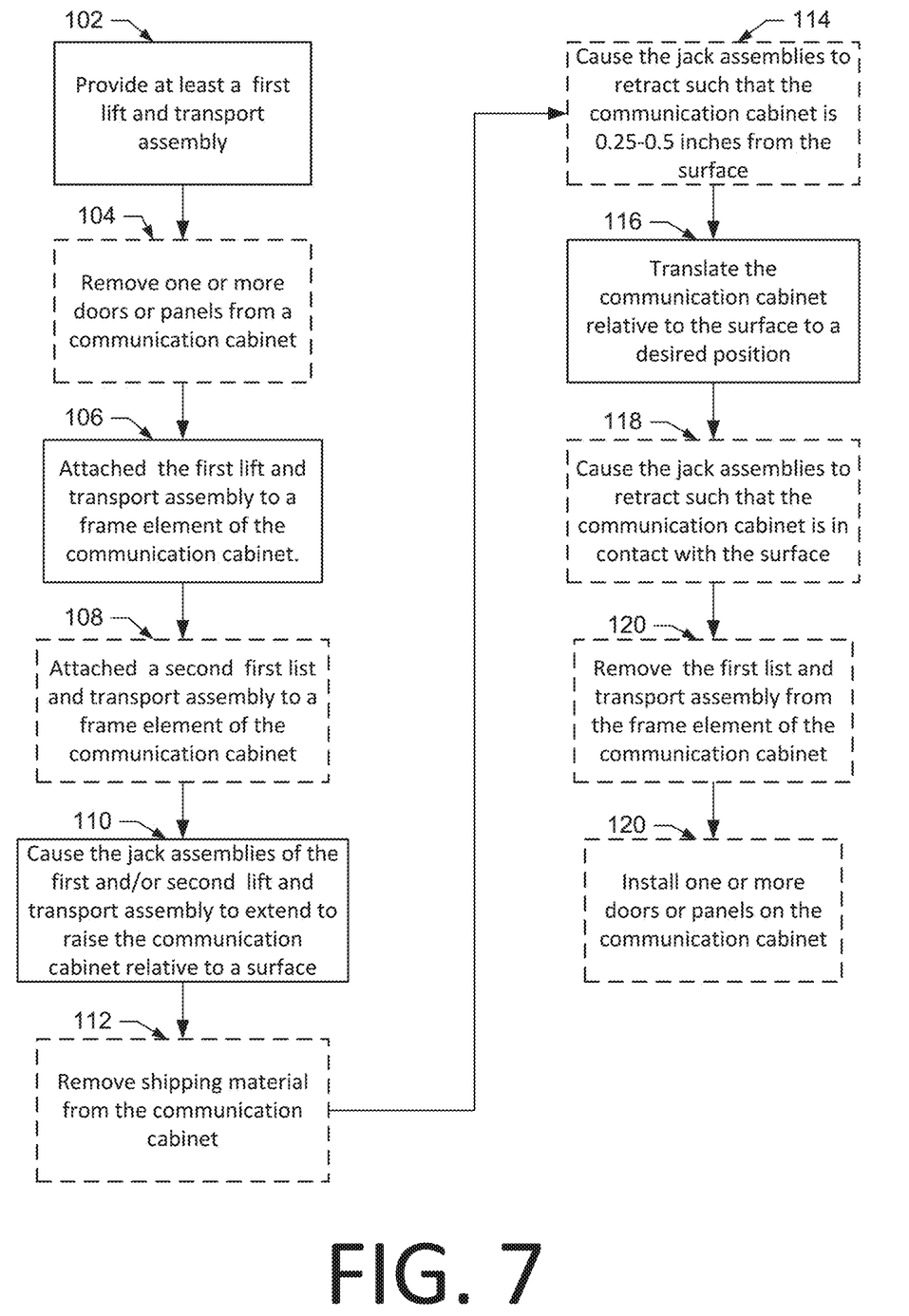
FIG. 7 illustrates a flow chart of a method of transporting a communication cabinet according to an example embodiment.

Turning to FIG. 7, and referring to FIGS. 1-6, a method of transporting a communication cabinet using the lift and transport system 10 is provided. The method operations may be performed in the listed order or in other alternative order. Additionally, some processes may be omitted or be optional, such as operations identified by dotted lines.

The method starts at operation 102, providing at least a first lift and transport assembly 10. Typically, two or more lift and transport assemblies 11 may be utilized to provide stability during lifting and transport operations discussed below.

At operation 104, one or more panels or doors may be removed from the communication cabinet 20 to provide access to the frame elements 22. Additionally, removal of the door and/or panels may enable the support bar 12 to pass through a portion of the communication cabinet 20, as shown in FIGS. 1 and 2.

At operation 106, the first lift and transport assembly 11 may be attached to one or more frame elements 22 of the communication cabinet 20. If the lift and transport assembly 11 includes a pivotable bar mount 40, the bar mount 40 may be unpinned and transitioned from the horizontal storage position to the vertical service position. Additionally or alternatively, the bar mount 40 of the lift and transport assembly 11 may be moved to a desired position along the support bar 12. For example, the bar mount 40 may be positioned such that the caster jack 14 is proximate to a vertical frame element 22. The apertures in the attachment bracket 16 may be aligned with mounting holes 24 in the frame element 22 and fasteners 18 passed therethrough. The antitorque feature 30 may be positioned to abut or nearly abut the frame element 22 and the fasteners 18 may be tightened.

At operation 108, a second lift and transport assembly 11 may be attached to the communication cabinet 20, in a manner substantially similar to operation 106. For example, the first and second lift and transport assemblies 11 may be positioned such that the caster jacks 14 are positioned near the corners of the communication cabinet 20 to provide a stable lifting and transport configuration. Connection of the lift and transport system 10 to the frame elements 22 in operations 106 and/or 108 may eliminate any need to tilt the communication cabinet 20 to attached a transport system, which may thereby reduce risk associated with transporting the communication cabinet 20.

At operation 110, the jack assemblies 44 of the first and/or second lift and transport assemblies 11 to be caused to extend to raise the communication cabinet 20 relative to a surface. For example, the operator, such as the crack operator or hydraulic operator, may be used to cause the jack assemblies 44 extend from a lowered position to a raised position. In some embodiments, the jack assemblies 44 may be extended substantially together, such that the communication cabinet 20 maintains substantially level through the raising or lowering operation. The communication cabinet 20 may be maintained substantially normal, e.g. perpendicular to the surface. Since the communication cabinet is maintained in a substantially normal position, risk of tipping the communication cabinet is reduced or eliminated.

At operation 112, shipping material may be removed from the communication cabinet. For example, communication cabinets 20 may be generally shipped on pallets, which are removed at the location of installation. In the raised position, the pallets may be simply slid out from beneath the communication cabinet 20, without tilting or sliding of the communication cabinet 20, that may increase the risk of injury to personnel or equipment damage. Other shipping materials, such as shrink wrap, padding, or the like may also be removed with the communication cabinet 20 in a stable condition suspended from the surface, which may reduce resistance from materials that might otherwise be partially trapped beneath the communication cabinet 20.

At operation 114, the jack assemblies 44 may be retracted such that the communication cabinet 20 is approximately 0.25-0.5 inches from the surface, e.g. a transport position.

The communication cabinet 20 may initially be raised to 2-3 inches from the surface at operation 110 to enable shipping material to be removed at operation 112. More particularly, the communication cabinet 20 may be initially raised to a higher raised position to remove a shipping pallet. Thereafter, the communication cabinet 20 may be lowered to the transport position, which may be high enough to clear any obstacles in the transport path, but also as low as practical to increase stability and reduce tip risk.

At operation 116, the communication cabinet 20 may be translated, on the lift and transport system 10 about the surface to a desired position. As discussed above, the lift and transport system 10 includes large, e.g. greater than 4-inch, casters wheels 42 for transportation. The larger casters wheels 42 may easily traverse doorway thresholds, lifting ramp edges, floor tile or elevator gaps, or the like, without adding to the overall height of the communication cabinet 20 itself. An additional benefit of the lift and transport assemblies 11 being attached to the frame elements 22 for the communication cabinet is that the communication cabinets 20 may abut another structure without the lift and transport assembly 11 interfering. In other words, the communication cabinet 20 may be transported into position directly next to, e.g. in contact with, another communication cabinet, wall or other equipment without the lift and transport system 10 being in the way or causing complication during removal.

Once the communication cabinet 20 is in the desired position, the jack assemblies 44 may be retracted, at operation 118, such that the communication cabinet 20 is in contact with the surface. The weight of the communication cabinet 20 is thereby removed from the lift and transport system 10.

At operation 120, the first and/or second lift and transport assemblies 11 may be removed from the frame elements 22 of the communication cabinet 20. At operation 122, door or panels may be installed on the communication cabinet. For example, any door or panels removed in operation 104 may be reinstalled. Additionally or alternatively, doors and/or panels may be initially installed if not shipped installed on the communication cabinet. In some instances, cable or fiber routing and/or equipment installation may be performed prior to installing the doors and/or panels to enable greater access to the communication cabinet 20.

In an example embodiment, a communication cabinet lift and transport system is provided including a first lift and transport assembly. The first lift and transport assembly including a first support bar having at least one attachment bracket configured to be attached to a frame of the communication cabinet and a first caster jack disposed near a first end of the first support bar and a second caster jack disposed near a second end of the first support bar. Each caster jack of the first caster jack and the second caster jack includes a bar mount configured to affix the caster jack to the first support bar, a caster wheel disposed at an end of the caster jack, and a jack assembly configured to extend and retract the caster wheel relative to the bar mount. The communication cabinet lift and transport system is configured to raise and lower the communication cabinet relative to a surface, and translate the communication cabinet about the surface when the lift and transport system is in a raised position.

In some example embodiments, the communication cabinet lift and transport system also includes a second lift and transport assembly, which includes a second support bar having at least one attachment bracket configured to be attached to the frame of the communication cabinet and a third caster jack disposed near a first end of the second support bar and a fourth caster jack disposed near a second end of the second support bar. In an example embodiment, the communication cabinet is in contact with the surface in a lowered position. In some example embodiments, the raised position is about 0.25 inches to about 2.5 inches from the surface. In an example embodiment, the support bar has a rectangular cross section. In some example embodiments, the first caster jack and second caster jack include a crank operator configured to extend and retract the caster jack between a raised position and the lowered position. In an example embodiment, the first caster jack and the second caster jack each include a hydraulic operator configured to extend and retract the caster jack between a raised position and the lowered position. In some example embodiments, the at least one attachment bracket comprises two attachment brackets configured to vertical frame member of the communication cabinet. In an example embodiment, the at least one attachment bracket is permanently affixed to the first support bar. In some example embodiments, the at least one attachment bracket is selectively affixed to the first support bar in one of a plurality of mounting locations along the first support bar. In an example embodiment, the communications cabinet lift and transport system is configured to maintain the communication cabinet normal to the surface. In some example embodiments, the caster wheel is configured to swivel 360 degrees about an axis defined by the jack assembly. In an example embodiment, the caster wheel has a diameter of at least 4 inches.

In another example embodiment a method for transporting a communication cabinet is provided including providing a first lift and transport assembly. The lift and transport system including a first support bar having at least one attachment bracket and a first caster jack disposed near a first end of the first support bar and a second caster jack disposed near a second end of the first support bar. Each caster jack of the first caster jack and the second caster jack including a bar mount configured to affix the caster jack to the support bar, a caster wheel disposed at an end of the caster jack, and a jack assembly configured to extend and retract the caster wheel relative to the bar mount. The method also includes attaching the at least one attachment bracket to a frame of the communication cabinet, causing the jack assembly to extend to raise the communication cabinet relative to a surface, and translating the communication cabinet relative to the surface.

In an example embodiment, the method also includes attaching a second lift and transport assembly to the frame of the communication cabinet. In some example embodiments, the method also includes causing a jack assembly of the second lift and transport assembly to extend with the extension of the jack assembly of the first lift and transport assembly, such that the communication cabinet is maintained substantially normal to the surface. In an example embodiment, the method also includes causing the jack assembly to retract to lower the communication cabinet into contact with the surface. In some example embodiments, the method also includes removing the first lift and transport system from the frame of the communication cabinet. In an example embodiment, the method also includes removing at least one door or panel from the communication cabinet to enable access to the frame of the communication cabinet.

In some example embodiments, the at least one attachment bracket and the frame each include at least one aperture, and wherein the attaching the at least one attachment bracket to the frame comprises installing one or more fasteners into aperture of the at least one attachment bracket and aperture the frame.

It will be apparent to those skilled in the art that various modifications and variations can be made without departing from the spirit or scope of the illustrated embodiments. Since modifications, combinations, sub-combinations and variations of the disclosed embodiments that incorporate the spirit and substance of the illustrated embodiments may occur to persons skilled in the art, the description should be construed to include everything within the scope of the appended claims and their equivalents.

What is claimed is:

1. A communication cabinet lift and transport system comprising:
   a first lift and transport assembly comprising:
      a first support bar having at least one attachment bracket configured to be attached to a frame of a communication cabinet, wherein the first support bar comprises a metal tubing and is configured to pass through an interior of the communication cabinet, the first support bar configured to attach to a pair of uprights of the communication cabinet; and
      a first caster jack disposed near a first end of the first support bar and a second caster jack disposed near a second end of the first support bar, each caster jack of the first caster jack and the second caster jack comprising:
         a bar mount configured to affix the caster jack to the first support bar;
         a caster wheel disposed at an end of the caster jack; and
         a jack assembly configured to extend and retract the caster wheel relative to the bar mount,
      wherein the communication cabinet lift and transport system is configured to raise and lower the communication cabinet relative to a surface, and translate the communication cabinet about the surface when the communication cabinet lift and transport system is in a raised position.

2. The communication cabinet lift and transport system of claim 1 further comprising:
   a second lift and transport assembly comprising:
      a second support bar having at least one attachment bracket configured to be attached to the frame of the communication cabinet; and
      a third caster jack disposed near a first end of the second support bar and a fourth caster jack disposed near a second end of the second support bar.

3. The communication cabinet lift and transport system of claim 1, wherein the communication cabinet lift and transport system is configured to place the communication cabinet in contact with the surface in a lowered position.

4. The communication cabinet lift and transport system of claim 1, wherein the raised position is about 0.25 inches to about 2.5 inches from the surface.

5. The communication cabinet lift and transport system of claim 1, wherein the first support bar has a rectangular cross section.

6. The communication cabinet lift and transport system of claim 1, wherein the first caster jack and the second caster jack comprise:
   a crank operator configured to extend and retract the caster jack between the raised position and a lowered position.

7. The communication cabinet lift and transport system of claim 1, wherein the first caster jack and the second caster jack each comprise:
   a hydraulic operator configured to extend and retract the caster jack between the raised position and a lowered position.

8. The communication cabinet lift and transport system of claim 1, wherein the at least one attachment bracket comprises two attachment brackets, each configured to attach to a vertical frame member of the communication cabinet.

9. The communication cabinet lift and transport system of claim 1, wherein the at least one attachment bracket is permanently affixed to the first support bar.

10. The communication cabinet lift and transport system of claim 1, wherein the at least one attachment bracket is selectively affixed to the first support bar in one of a plurality of mounting locations along the first support bar.

11. The communication cabinet lift and transport system of claim 1, wherein the communication cabinet lift and transport system is configured to maintain the communication cabinet normal to the surface.

12. The communication cabinet lift and transport system of claim 1, wherein the caster wheel is configured to swivel 360 degrees about an axis defined by the jack assembly.

13. The communication cabinet lift and transport system of claim 1, wherein the caster wheel has a diameter of at least 4 inches.

14. A method for transporting a communication cabinet comprising:
   providing a first lift and transport assembly comprising:
      a first support bar having at least one attachment bracket, wherein the first support bar comprises a metal tubing and is configured to pass through an interior of the communication cabinet, the first support bar configured to attach to a pair of uprights of the communication cabinet; and
      a first caster jack disposed near a first end of the first support bar and a second caster jack disposed near a second end of the first support bar, each caster jack of the first caster jack and the second caster jack comprising:
         a bar mount configured to affix the caster jack to the first support bar;
         a caster wheel disposed at an end of the caster jack, wherein the caster wheel is exterior to the interior of the communication cabinet; and
         a jack assembly configured to extend and retract the caster wheel relative to the bar mount;
   attaching the at least one attachment bracket to a frame of the communication cabinet;
   causing the jack assembly to extend to raise the communication cabinet relative to a surface; and
   translating the communication cabinet relative to the surface.

15. The method of claim 14 further comprising:
   attaching a second lift and transport assembly to the frame of the communication cabinet.

16. The method of claim 15 further comprising:
   causing a jack assembly of the second lift and transport assembly to extend with the extension of the jack assembly of the first lift and transport assembly, such that the communication cabinet is maintained substantially normal to the surface.

17. The method of claim 14 further comprising:
   causing the jack assembly to retract to lower the communication cabinet into contact with the surface.

18. The method of claim 14 further comprising:
   removing the first lift and transport system from the frame of the communication cabinet.

19. The method of claim 14 further comprising:
removing at least one door or panel from the communication cabinet to enable access to the frame of the communication cabinet.

20. The method of claim 14, wherein the at least one attachment bracket and the frame each include at least one aperture, and wherein the attaching the at least one attachment bracket to the frame comprises installing one or more fasteners into aperture of the at least one attachment bracket and aperture the frame.

* * * * *